United States Patent
Balteanu et al.

(10) Patent No.: US 10,181,820 B2
(45) Date of Patent: Jan. 15, 2019

(54) POWER AMPLIFICATION SYSTEM WITH ENVELOPE-BASED BIAS

(71) Applicant: SKYWORKS SOLUTIONS, INC., Woburn, MA (US)

(72) Inventors: Florinel G. Balteanu, Irvine, CA (US); Paul T. DiCarlo, Marlborough, MA (US); Boshi Jin, Winchester, MA (US); Serge Francois Drogi, Flagstaff, AZ (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/596,149

(22) Filed: May 16, 2017

(65) Prior Publication Data

US 2017/0338773 A1 Nov. 23, 2017

Related U.S. Application Data

(60) Provisional application No. 62/337,474, filed on May 17, 2016.

(51) Int. Cl.
| | |
|---|---|
| H03F 1/02 | (2006.01) |
| H03F 1/56 | (2006.01) |
| H03F 3/19 | (2006.01) |
| H03F 3/345 | (2006.01) |
| H03F 1/22 | (2006.01) |
| H03F 3/24 | (2006.01) |

(52) U.S. Cl.
CPC ......... *H03F 1/0277* (2013.01); *H03F 1/0266* (2013.01); *H03F 1/0272* (2013.01); *H03F 1/223* (2013.01); *H03F 1/56* (2013.01); *H03F 3/19* (2013.01); *H03F 3/245* (2013.01); *H03F 3/345* (2013.01); *H03F 2200/102* (2013.01); *H03F 2200/222* (2013.01); *H03F 2200/387* (2013.01); *H03F 2200/451* (2013.01); *H03F 2203/7206* (2013.01)

(58) Field of Classification Search
CPC ...................................................... H03F 1/0277
See application file for complete search history.

(56) References Cited

U.S. PATENT DOCUMENTS

| | | | | |
|---|---|---|---|---|
| 5,420,536 A | * | 5/1995 | Faulkner | H03C 3/406 330/129 |
| 5,880,633 A | * | 3/1999 | Leizerovich | H03F 1/0222 330/124 R |
| 6,157,253 A | * | 12/2000 | Sigmon | H03F 1/0222 330/10 |
| 9,716,477 B2 | * | 7/2017 | Wagh | H03F 3/211 |
| 2005/0151586 A1 | * | 7/2005 | Grillo | H03F 1/0222 330/136 |

(Continued)

*Primary Examiner* — Patricia T Nguyen
(74) *Attorney, Agent, or Firm* — Chang & Hale LLP

(57) ABSTRACT

Disclosed herein are power amplification systems that are dynamically biased based on a signal indicative of an envelope of the signal being amplified. The power amplification systems include a power amplifier configured to amplify an input radio-frequency (RF) signal to generate an output RF signal when biased by a biasing signal. The power amplification systems also include a bias component configured to generate the biasing signal based on an envelope signal indicative of an envelope of the input RF signal. The biasing signal can improve or enhance the linearity of the power amplification systems.

19 Claims, 11 Drawing Sheets

(56) References Cited

U.S. PATENT DOCUMENTS

| | | | |
|---|---|---|---|
| 2010/0085120 A1* | 4/2010 | Marbell | H03F 1/0222 330/296 |
| 2013/0285750 A1* | 10/2013 | Chowdhury | H03F 1/0222 330/296 |
| 2014/0049322 A1* | 2/2014 | Jeon | H03F 1/0222 330/285 |
| 2014/0065986 A1* | 3/2014 | McCallister | H03F 1/3247 455/91 |
| 2014/0184334 A1* | 7/2014 | Nobbe | H03F 1/0227 330/291 |
| 2016/0126901 A1* | 5/2016 | Knopik | H03F 1/0266 330/296 |

* cited by examiner

POWER AMPLIFICATION SYSTEM WITH ENVELOPE-BASED BIAS

CROSS-REFERENCE TO RELATED APPLICATIONS

This application claims priority to U.S. Prov. App. No. 62/337,474 filed May 17, 2016 and entitled "POWER AMPLIFICATION SYSTEM WITH ENVELOPE-BASED BIAS," which is expressly incorporated by reference herein in its entirety for all purposes. This application is also related to U.S. patent application Ser. No. 15/221,489 filed on Jul. 27, 2016 and entitled "POWER AMPLIFICATION SYSTEM WITH PROGRAMMABLE LOAD LINE," which is expressly incorporated by reference herein in its entirety for all purposes.

BACKGROUND

Field

The present disclosure relates to power amplification systems configured to amplify signals for wireless communication.

Description of Related Art

Power amplification systems can be used to amplify wireless signals for transmission. These amplification systems can be powered using a supply voltage. The supply voltage can be varied based on an envelope of the signal to be amplified to improve power amplifier efficiency, otherwise known as envelope tracking.

SUMMARY

According to a number of implementations, the present disclosure relates to a power amplification system that includes a power amplifier configured to amplify an input radio-frequency (RF) signal to generate an output RF signal when biased by a biasing signal, and a bias component configured to generate the biasing signal based on an envelope signal indicative of an envelope of the input RF signal.

In some embodiments, the system further includes a supply component configured to generate an envelope-based supply voltage for powering the power amplifier. In further embodiments, the biasing signal is configured to enhance a linearity of the power amplifier.

In some embodiments, the power amplifier includes a cascode power amplifier including a first transistor and a second transistor. In further embodiments, the first transistor has a gate to receive the biasing signal, a drain coupled to a supply voltage, and a source coupled to a drain of the second transistor. In further embodiments, the second transistor has a gate coupled to a supplemental biasing signal and a source coupled to a ground voltage. In further embodiments, the supplemental biasing signal is based on the envelope signal. In some further embodiments, the supplemental biasing signal is independent of the envelope signal. In some further embodiments, the input RF signal is received at an input RF port coupled to the gate of the second transistor and the output RF signal is provided at an output RF port coupled to the drain of the first transistor. In further embodiments, the input RF port is coupled to the gate of the second transistor via an input matching component and the output RF port is coupled to the drain of the first transistor via an output matching component.

In some embodiments, the system also includes a bias time alignment circuit configured to align in time the biasing signal with the envelope signal. In further embodiments, the system also includes an envelope alignment circuit configured to align in time the biasing signal and the envelope signal. In further embodiments, the system also includes a bias shaping circuit configured to manipulate a shape of the biasing signal to enhance linearity or efficiency of the power amplifier.

In some embodiments, the power amplifier includes a plurality of cascode amplifiers coupled in parallel. In further embodiments, the system also includes one or more switches configured to pass or block the biasing signal to a respective one or more of the plurality of cascode amplifiers. In further embodiments, the system also includes a controller configured to set a respective state of the one or more switches based on a power output.

In a number of implementations, the present disclosure relates to a radio-frequency (RF) module that includes a packaging substrate configured to receive a plurality of components. The RF module also includes a power amplification system implemented on the packaging substrate, the power amplification system including a power amplifier configured to amplify an input radio-frequency (RF) signal to generate an output RF signal when biased by a biasing signal and a bias component configured to generate the biasing signal based on an envelope signal indicative of an envelope of the input RF signal.

In some embodiments, the power amplifier includes a cascode power amplifier including a first transistor and a second transistor, the first transistor being biased by the biasing signal, the second transistor being biased by a supplemental biasing signal. In some embodiments, the RF module also includes a supply component implemented on the packaging substrate, the supply component configured to generate an envelope-based supply voltage for powering the power amplifier.

According to a number of implementations, the present disclosure relates to a wireless device that includes a transceiver configured to generate a radio-frequency (RF) signal. The wireless device also includes a front-end module (FEM) in communication with the transceiver, the FEM including a packaging substrate configured to receive a plurality of components, the FEM further including a power amplification system implemented on the packaging substrate, the power amplification system including a power amplifier configured to amplify an input radio-frequency (RF) signal to generate an output RF signal when biased by a biasing signal and a bias component configured to generate the biasing signal based on an envelope signal indicative of an envelope of the input RF signal. The wireless device also includes an antenna in communication with the FEM, the antenna configured to transmit the output RF signal received from the power amplification system.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
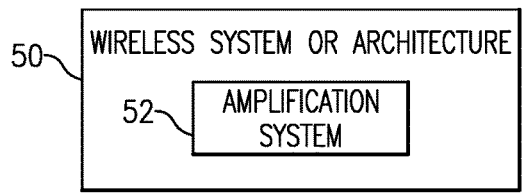
FIG. 1 illustrates an example wireless system or architecture having an amplification system.

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
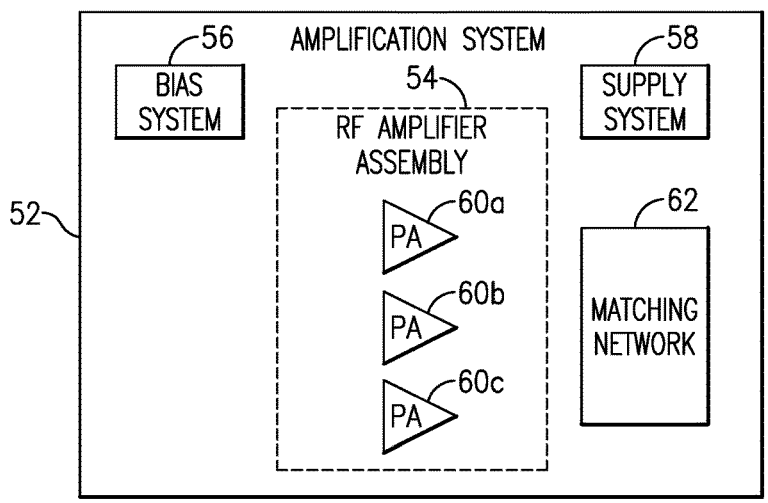
FIG. 2 illustrates an example amplification system having an amplifier assembly with one or more power amplifiers.

FIG. 2 shows that the amplification system 52 of FIG. 1 typically includes a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device.

The PAs (e.g., 60a-60c) in the amplification system 52 are typically biased by a bias system 56. Further, supply voltages for the PAs are typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
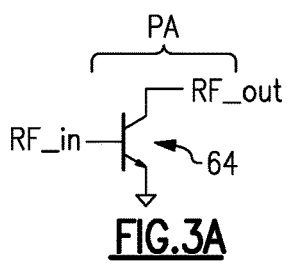
FIGS. 3A, 3B, 3C, 3D, and 3E illustrate example implementations of power amplifiers.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
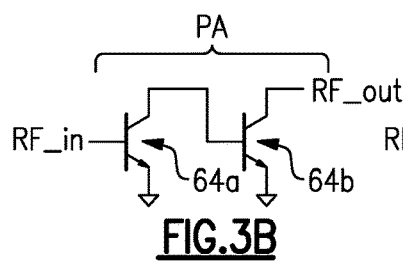

FIG. 3B shows an example PA having a plurality of amplifying transistors (e.g., 64a, 64b) arranged in stages. An input RF signal (RF_in) is provided to a base of the first transistor 64a, and an amplified RF signal from the first transistor 64a is output through its collector. The amplified RF signal from the first transistor 64a is provided to a base of the second transistor 64b, and an amplified RF signal from the second transistor 64b is output through its collector to thereby yield an output RF signal (RF_out) of the PA.

Figure 3C:
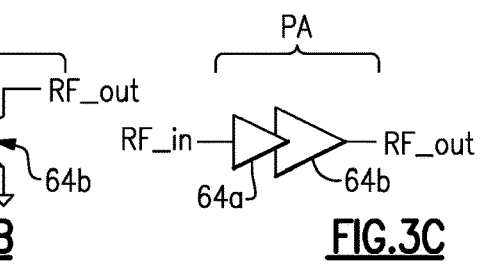

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
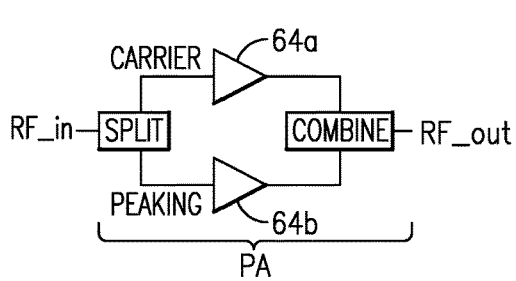

FIG. 3D shows that in some embodiments, a PA can be configured as a Doherty PA. Such a Doherty PA can include amplifying transistors 64a, 64b configured to provide carrier amplification and peaking amplification of an input RF signal (RF_in) to yield an amplified output RF signal (RF_out). The input RF signal can be split into the carrier portion and the peaking portion by a splitter. The amplified carrier and peaking signals can be combined to yield the output RF signal by a combiner.

Figure 3E:
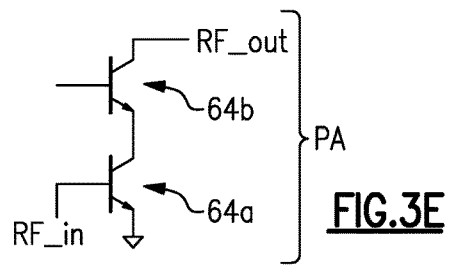

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4A:
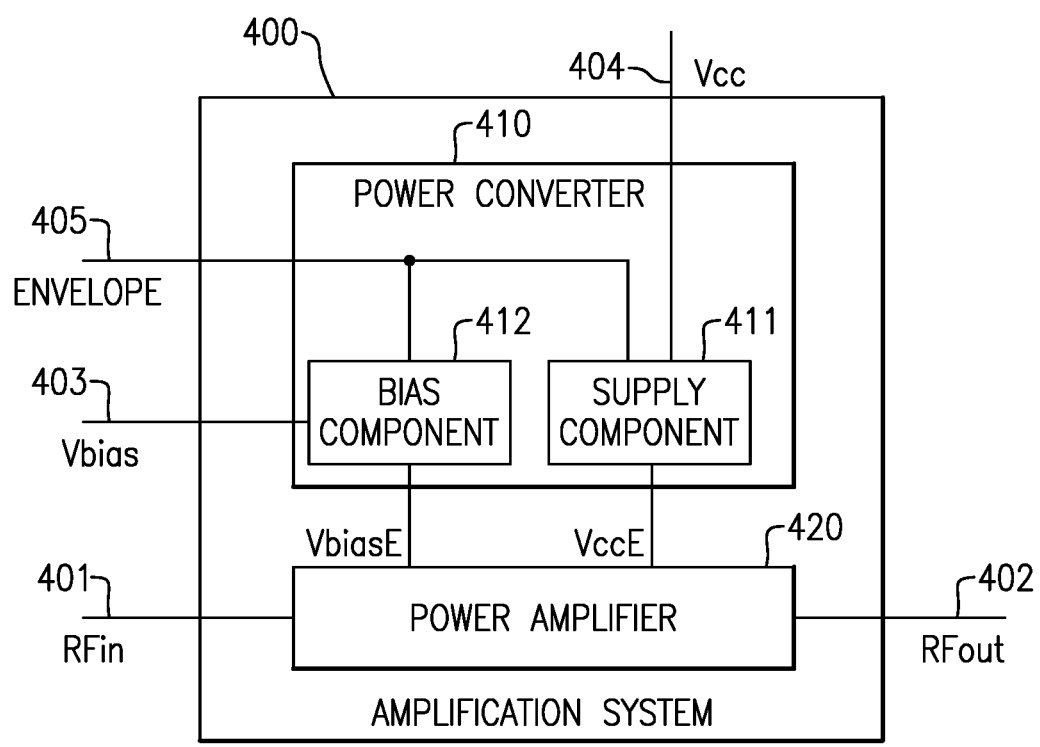
FIG. 4A illustrates an example amplification system having a power amplifier biased by a biasing signal based on a received envelope signal.

FIG. 4A shows that in some embodiments, an amplification system 400 can include a power amplifier 420 biased by a biasing signal based on a received envelope signal. The amplification system 400 includes a power amplifier 420 that receives an input RF signal (RFin) at an input port 401 and provides, as an output RF signal (RFout) at an output port 402, an amplified version of the input RF signal. The power amplifier 420 can be, for example, any of the power amplifiers of FIGS. 3A-3E. In some implementations, and as described further below, the power amplifier 420 includes a cascode amplifier.

The power amplifier 420 receives an envelope-based biasing signal (VbiasE) for biasing the power amplifier 420. In particular, the envelope-based biasing signal can bias one or more transistors of the power amplifier 420. The envelope-based biasing signal can be, for example, a current or a voltage. The power amplifier also receives an envelope-based supply voltage (VccE) for powering the power amplifier 420. Each of the envelope-based biasing signal and the envelope-based supply voltage are based on an envelope signal received by the amplification system 400 via an envelope port 405.

Accordingly, the amplification system 400 can be configured to adjust a supply voltage to the power amplifier 420 based on an envelope of the RF signal to be amplified. This can improve efficiency of the power amplifier 420. In addition, the amplification system is configured to adjust a bias voltage to the power amplifier 420 based on the envelope of the RF signal to be amplified. This can improve linearity of the power amplifier 420 in addition to providing improved efficiency.

Thus, the amplification system 400 is configured to bias the power amplifier 420 using envelope tracking to operate the power amplifier 420 so that targeted or desirable characteristics are achieved. For example, the amplification system 400 can bias the power amplifier 420 to improve linearity of the amplification process or so that the power amplifier 420 operates in a linear region. This can be done to extend the signal ranges over which the power amplifier 420 provides linear amplification.

In addition, dynamic and intelligent biasing of the power amplifier 420 can improve efficiency. For example, biasing the power amplifier 420 using a biasing signal that varies in response to the envelope of the signal to be amplified can extend the output range of the power amplifier 420. For static biasing voltages or for voltages that do not vary as the signal envelope varies, a power amplifier may reach voltage limits beyond which amplification becomes undesirably or unacceptably non-linear (e.g., non-linearity of the amplification is outside a targeted range). Thus, by varying a bias signal to the power amplifier 420, the range over which the power amplifier 420 can operate efficiently can be extended. Moreover, the power amplifier 420 can be caused to operate in a targeted linear region using such varying bias signals.

The amplification system 400 includes a power converter 410 that receives a supply voltage (Vcc) via a supply port 404, a biasing signal (Vbias) via a bias port 403, and an envelope signal via the envelope port 405. The envelope signal is indicative of an envelope of the input RF signal. In various implementations, the envelope signal is an analog signal or a digital signal. The power converter 410 (or, in particular, a supply component 411 thereof) converts, based on the envelope signal, the supply voltage into the envelope-based supply voltage provided to the power amplifier 420. Similarly, the power converter 410 (or, in particular, a bias component 412 thereof) converts, based on the envelope signal, the biasing signal into the envelope-based biasing signal.

Thus, the amplification system 400 includes a power amplifier 420 configured to amplify an input radio-frequency (RF) signal to generate an output RF signal when biased by a biasing signal (e.g., the envelope-based biasing signal (VbiasE)). The amplification system 400 further includes a bias component 412 configured to generate the biasing signal based on an envelope signal indicative of an envelope of the input RF signal. The amplification system 400 further includes a supply component 411 configured to generate an envelope-based supply voltage (VccE) for powering the power amplifier 420.

Figure 4B:
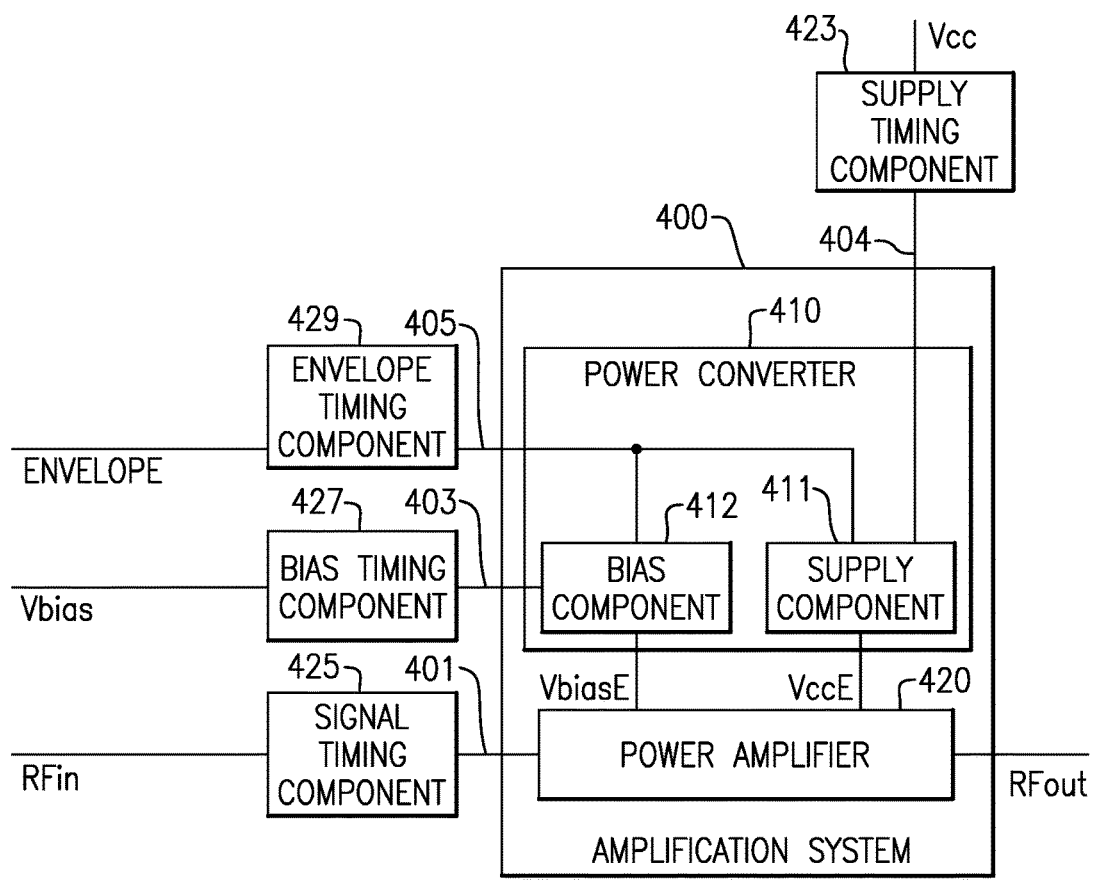
FIG. 4B illustrates an example amplification system having a power amplifier biased by a biasing signal based on a received envelope signal with additional time alignment elements.

FIG. 4B illustrates the amplification system 400 of FIG. 4A with the power amplifier 420 biased by a biasing signal based on a received envelope signal with additional time alignment elements 423, 425, 427, 429. A supply timing component 423 (e.g., a time alignment circuit) can be configured to adjust the timing (e.g., delay) the supply signal (e.g., supply voltage) received at the supply port 404. Similarly, a signal timing component 425 (e.g., a time alignment circuit) can be configured to adjust the timing (e.g., delay) the signal received at the input port 401. Similarly, a bias timing component 427 (e.g., a time alignment circuit) can be configured to adjust the timing (e.g., delay) the bias voltage received at the bias port 403. Likewise, an envelope timing component 429 (e.g., a time alignment circuit) can be configured to adjust the timing (e.g., delay) the envelope signal received at the envelope port 405.

The timing components 423, 425, 427, 429 (e.g., time alignment circuits) can be configured to align the RF input signal (e.g., RFin) with one or more of the envelope signal, the bias signal (e.g., Vbias), and the supply signal (e.g., Vcc). This can be done, for example, so that the envelope of the supply signal delivered to the amplifier 420 is aligned with the envelope of the signal to be amplified (e.g., RFin). Alignment of these signals can increase power efficiency of the power amplifier 420 and reduce distortions of the amplifier output signal (e.g., RFout).

The respective timing components 423, 425, 427, 429 can include delays, time shifting elements, feedback circuits, digital signal processors (DSPs), field programmable gate arrays (FPGAs), application specific integrated circuits (ASICs) or the like to determine alignment parameters and/or to adjust the timing of an input signal. In some embodiments, one or more of the respective timing components 423, 425, 427, 429 can employ time alignment algorithms that can be implemented via software (e.g., on DSPs), hardware (e.g., via FPGAs), or a combination of software and hardware. Further description and examples of time alignment components and circuits are provided in U.S. Pat. No. 8,718,188 entitled "Apparatus and methods for envelope tracking," issued May 6, 2014; U.S. Pat. No. 8,908,797 entitled "Apparatus and method for time alignment of an envelope tracking power amplifier," issued Dec. 9, 2014; and U.S. Pat. No. 8,514,018 entitled "Signal alignment for envelope tracking system," issued Aug. 20, 2013, each of which is expressly incorporated by reference herein in its entirety.

Figure 4C:
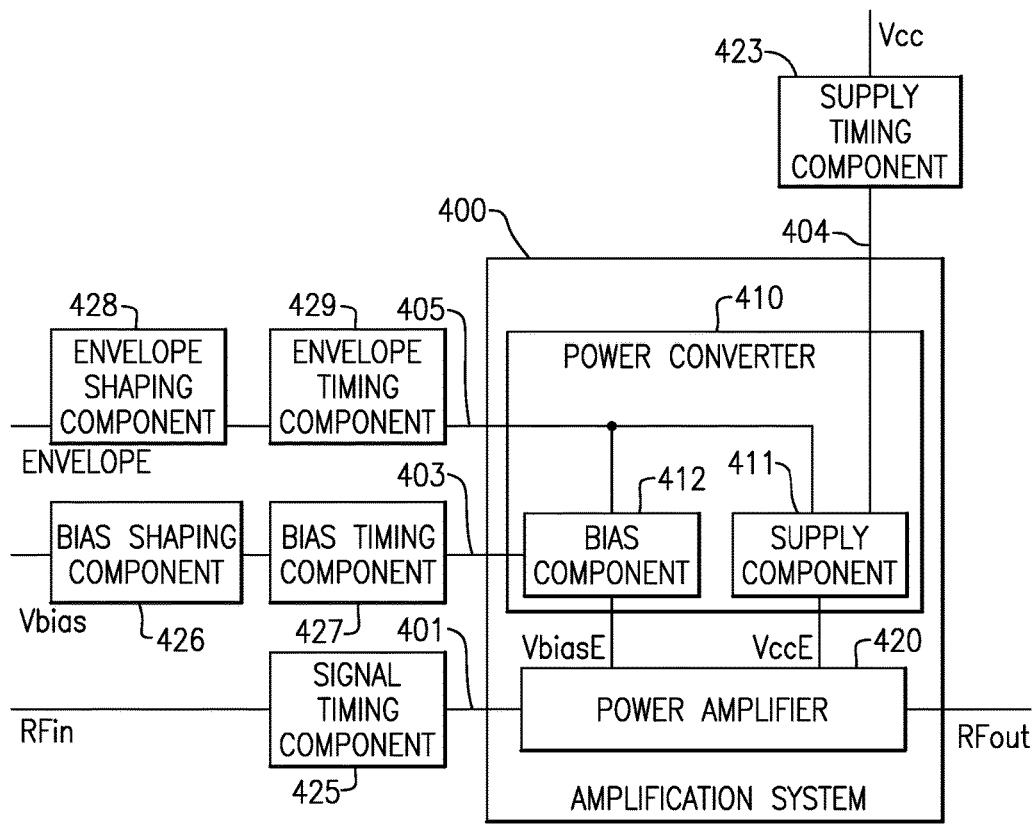
FIG. 4C illustrates an example amplification system having a power amplifier biased by a biasing signal based on a received envelope signal with additional signal shaping components.

FIG. 4C illustrates the example amplification system 400 of FIG. 4B that has a power amplifier 420 biased by a biasing signal based on a received envelope signal with additional signal shaping components 426, 428. A bias shaping component 426 (e.g., a shaping circuit) can be configured to shape the bias signal received at the bias port 403. In some embodiments, the bias shaping component 426 can receive the bias signal prior to the bias timing component 427. Similarly, an envelope shaping component 428 (e.g., a shaping circuit) can be configured to shape the envelope signal received at the envelope port 405. In some embodiments, the envelope shaping component 428 can receive the envelope signal prior to the envelope timing component 429.

The bias shaping component 426 and the envelope shaping component 428 can be configured to adjust the shape of the respective signals (e.g., the voltage and/or current as a function of time) to enhance efficiency and/or linearity. In some implementations, there may be a trade off when enhancing efficiency and linearity such that, improving or optimizing one (e.g., linearity or efficiency) means that the other (e.g., efficiency or linearity) may not be able to achieve a targeted improvement or optimization. Accordingly, the shaping components 426, 428 can shape the respective signals to preferably enhance linearity over efficiency, to enhance efficiency over linearity, or to balance enhancements to linearity and efficiency.

In some embodiments, the shaping components 426, 428 can include one or more lookup tables (LUTs) to determine signal shape for the respective signals. The LUTs can provide parameters that dictate changes or alterations to the shapes of the respective signals to achieve targeted performance in efficiency, linearity, or a combination of these.

The shaping components 426, 428 can include, for example and without limitation, analog-to-digital converters (ADCs), digital-to-analog converters (DACs), amplifiers, delays, digital signal processors (DSPs), field programmable gate arrays (FPGAs), application specific integrated circuits (ASICs) or the like to manipulate the shape of the respective input signals to provide a targeted output signal (e.g., an output or shaped envelope signal or an output or shaped bias signal). Further description and examples of signal shaping components and circuits are provided in U.S. Pat. No. 8,718,188 entitled "Apparatus and methods for envelope tracking," issued May 6, 2014, the entirety of which is expressly incorporated herein by reference.

Figure 5:
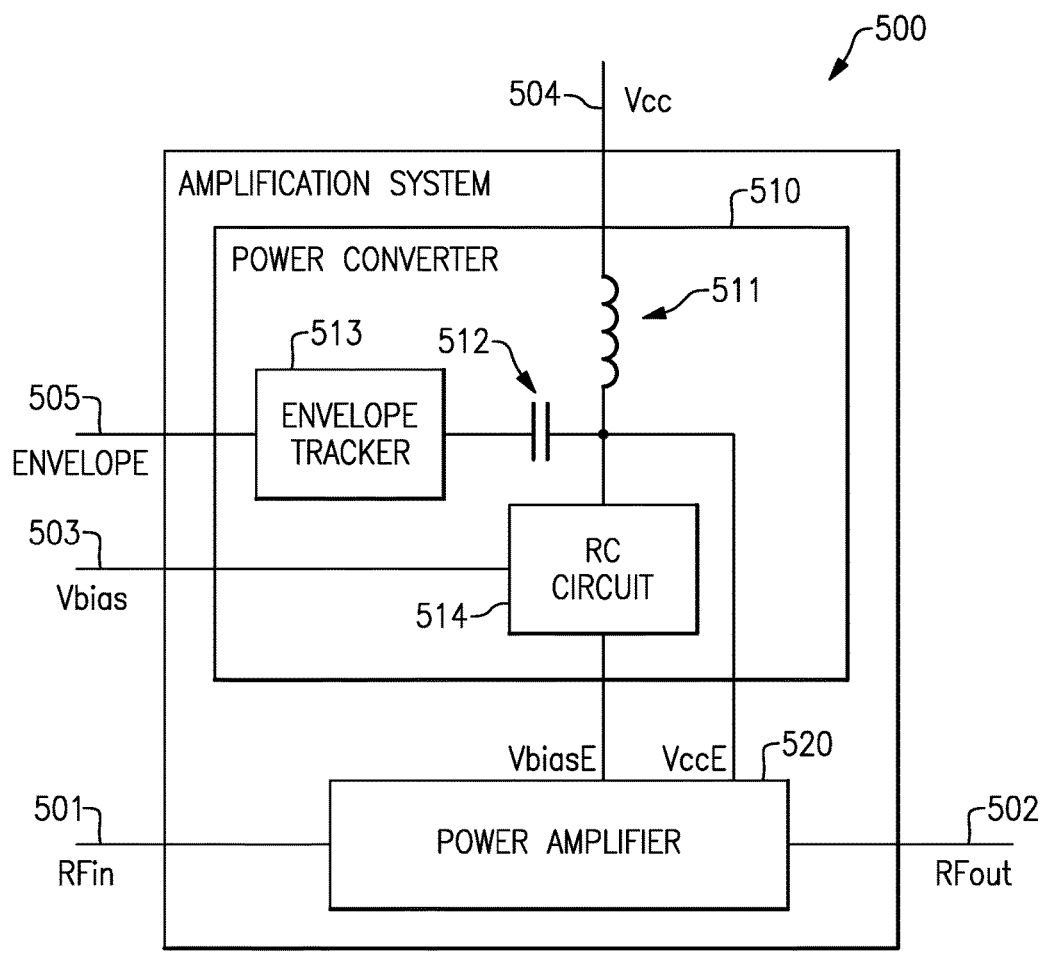
FIG. 5 illustrates an example amplification system having a power converter that converts a biasing signal into an envelope-based biasing signal via an RC circuit.

FIG. 5 shows that in some embodiments, an amplification system 500 can include a power converter 510 that converts a biasing signal into an envelope-based biasing signal via an RC circuit 514. Thus, in some implementations, a bias component configured to generate a biasing signal based on an envelope signal can include an RC circuit.

Like the amplification system 400 of FIG. 4, the amplification system 500 of FIG. 5 includes a power amplifier 520 that receives an input RF signal (RFin) at an input port 501 and provides, as an output RF signal (RFout) at an output port 502, an amplified version of the input RF signal.

The amplification system 500 includes a power converter 510 that receives a supply voltage (Vcc) via a supply port 504, a biasing signal (Vbias) via a bias port 503, and an envelope signal via an envelope port 505. The power converter 510 converts, based on the envelope signal, the supply voltage into the envelope-based supply voltage provided to the power amplifier 520. Similarly, the power converter 510 converts, based on the envelope signal, the biasing signal into the envelope-based biasing signal.

In some embodiments, and as shown in FIG. 5, the power converter 510 includes an envelope tracker 513 that tracks the envelope signal and/or provides a filtered or otherwise processed version of the envelope signal. Examples of such an envelope tracker 513 are described in detail below. The envelope tracker 513 can include, for example, a comparator (which can be implemented as an operational amplifier or other differential amplifier) and one or more passive devices (e.g., resistors and/or capacitors). In some implementations, the power converter 510 may not include an envelope tracker and can receive the envelope signal via the envelope port 505 in an appropriately filtered or otherwise processed form.

The power converter 510 includes an LC combiner that combines the output of the envelope tracker 513 and the supply voltage (Vcc) to form the envelope-based supply voltage (VccE). The LC combiner includes an inductor 511 coupled between the supply port 504 and the envelope-based supply input of the power amplifier 520. The LC combiner further includes a capacitor 512 coupled between the output of the envelope tracker 513 and the envelope-based supply input of the power amplifier 520. Thus, in some implementations, the envelope-based supply voltage is the combination of the envelope signal received via the envelope port 513 (or a tracked version of the envelope signal) and the supply voltage received via the supply port 504.

The power converter 510 includes an RC circuit 514 coupled between the bias port 503 and the envelope-based bias input of the power amplifier 520. The RC circuit 514 is further coupled to the output of the envelope tracker 513 via the capacitor 512 and coupled to the supply port 504 via the inductor 511. The RC circuit can include one or more resistors and/or one or more capacitors.

Figure 6A:
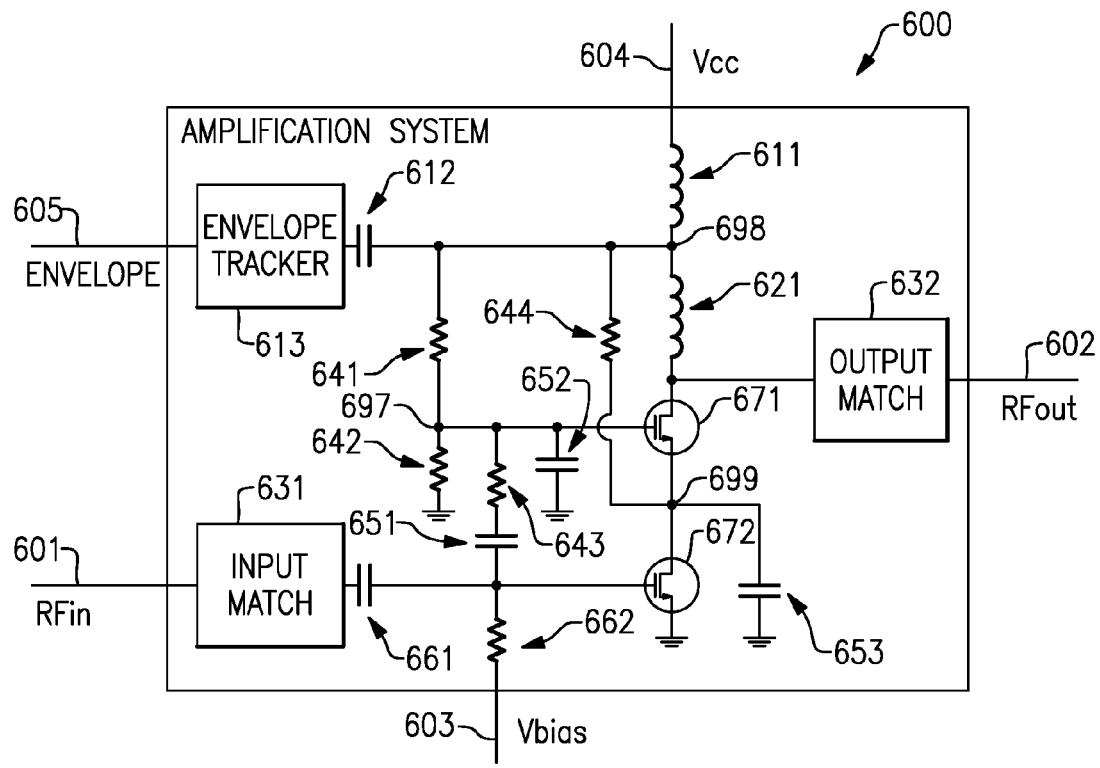
FIG. 6A illustrates an example amplification system that includes a cascode power amplifier.

FIG. 6A shows that in some embodiments, an amplification system 600 can include a cascode power amplifier. The amplification system 600 receives an input RF signal (RFin) via an input port 601 and provides, as an output RF signal (RFout) at an output port 602, an amplified version of the input RF signal. The amplification system 600 includes a bias port 603 for receiving a biasing signal to at least partially bias the cascode power amplifier (or one or more transistors 671, 672 thereof). The amplification system 600 includes a supply port 604 for receiving a supply voltage to power the cascode power amplifier. The amplification system 600 includes an envelope port 605 for receiving an envelope signal indicative of an envelope of the input RF signal.

The amplification system 600 includes a cascode amplifier in the form of a first transistor 671 and a second transistor 672. The first transistor 671 is configured as a common-base stage of the cascode amplifier and the second transistor 672 is configured as a common-emitter stage of the cascode amplifier.

Although the first transistor 671 and second transistor 672 are described herein as field-effect transistors (FETs), it will be understood that the transistors described herein may be implemented as other types of transistors, such as bipolar junction transistors (BJTs) (e.g., heterojunction bipolar transistors (HBTs)). Similarly, the use of particular terms, such as "gate", "drain", or "source" should not be taken to imply a particular transistor type, and should be considered interchangeable with other terms (such as "base", "collector", or "emitter") typically used to refer to other types of transistors.

The second transistor 672 has a gate coupled to the input port 601 via an input matching component 631 and a capacitor. The gate of the second transistor 672 is also coupled to the bias port 603 via a resistor 662. The capacitor 661 and the resistor 662 act as an RC combiner that combines that biasing signal (Vbias) and the matched input RF signal (RFin).

The second transistor 672 has a source coupled to a ground voltage and a drain coupled to an intermediate cascode node 699. The intermediate cascode node 699 may optionally be coupled to the ground voltage via a capacitor 653.

The first transistor 671 has a source coupled to the intermediate cascode node 699 and a drain coupled, via an output matching component 632, to the output port 602. The input matching component 631 and output matching component 632 can provide impedance matching functionality for the amplification system 600.

The drain of the first transistor 671 is coupled via an inductor 621 to an envelope-based supply node 698. The envelope-based supply node 698 is coupled, via an inductor 611, to the supply port 604 and is coupled, via a capacitor 612, to the output of an envelope tracker 613. The envelope tracker 613 receives the envelope signal via the envelope port 605 and provides a filtered or otherwise processed version of the envelope signal. The capacitor 612 and the inductor 611 act as an LC combiner that combines the processed envelope signal and the supply voltage to provide an envelope-based supply voltage at the envelope-based supply node 698.

The envelope-based supply node 698 and the intermediate cascode node 699 can be coupled by a resistor 644.

The envelope-based supply node 698 is coupled the ground voltage via a pair of resistors 641, 642. The pair of resistors 641, 642 act as a voltage divider, such that the voltage at a divided node 697 between the two resistors 641, 642 is approximately proportional to the voltage at the envelope-based supply node 698. In particular, the pair of resistors includes a resistor 641 coupled between the envelope-based supply node 698 and the divided node 697 and a resistor 642 coupled between the divided node 697 and the ground voltage. In various implementations, the pair of resistors 641, 642 can be replaced with another voltage divider.

The gate of the first transistor 671 is coupled to the divided node 697. Thus, the first transistor 671 is biased by the voltage at the divided node 697. In various implementations, the gate of the first transistor 671 is coupled to the ground voltage via a decoupling capacitor 652 which may act as an acceleration capacitor. In various implementations, the gate of first transistor 671 is coupled to the gate of the second transistor 672 via an impedance. As shown in FIG. 6A, such an impedance can include a resistor 643 and/or a capacitor 651.

Thus, in various implementations, the cascode power amplifier is biased by a voltage based on the envelope signal, e.g., the first transistor 671 is biased by the voltage at the divided node 697. Further, the cascode power amplifier is powered by a voltage based on the envelope signal, e.g., the cascode amplifier is powered by the voltage at the envelope-based supply node 698.

As described above, the cascode power amplifier include a first transistor 671 and a second transistor 672. The first transistor 671 has a gate to receive a biasing signal (e.g., is coupled to the divided node 697 and receives the envelope-based biasing signal at the divided node 697). The first transistor has a drain coupled to a supply voltage (e.g., is coupled to the envelope-based supply node 698 and receives the envelope-based supply voltage at the envelope-based supply node 698). The first transistor has a source coupled to the drain of the second transistor 672.

The second transistor 672 has a gate coupled to a supplemental biasing signal (e.g., the biasing signal received at the bias port 603 as influenced by the remainder of the amplification system) and a source coupled to the ground voltage.

In some implementations, the supplemental biasing signal is based on the envelope signal. For example, when the impedance between the gate of the first transistor 671 and the gate of the second transistor 672 has a small capacitance, the voltage at the gate of the second transistor 672 can be influenced by the voltage at the gate of the first transistor, which is based on the envelope signal.

In some implementations, the supplemental biasing signal is independent of the envelope signal. For example, when the impedance between the gate of the first transistor 671 and the gate of the second transistor 672 has a large capacitance (or such an impedance is absent, resulting in an open circuit between the two gates), the voltage at the gate of the second transistor 672 is not influenced by the envelope signal.

The various impedances shown in FIG. 6A (or subsets thereof) form a bias component that generates a biasing signal (e.g., the voltage at the gate of the first transistor 671) based on the envelope signal (received at the envelope port 605).

As shown in FIG. 6A, such a bias component can include an RC circuit, such as the RC circuit formed by the pair of resistors 641, 642 and the decoupling capacitor 652. Such a bias component can include an envelope tracker configured to provide a processed version of the envelope signal, such as the envelope tracker 613. Such a bias component can include the decoupling capacitor 652 coupled between the gate of the first transistor 671 and the ground voltage. Such a bias component can include a resistor (e.g., the resistor 644) coupled between a first node disposed between the first transistor 671 and the second transistor 672 (e.g., the intermediate cascode node 699) and a second node at a supply voltage of the power amplifier (e.g., the envelope-based supply node 698). Such a bias component can include a pair of impedances (such as the pair of resistors 641, 642) configured as a voltage divider, the pair of impedances including a first impedance coupled between the gate of the first transistor 671 and a ground voltage and a second impedance coupled between the gate of the first transistor 671 and a supply voltage of the power amplifier (e.g., at the envelope-based supply node 698). Such a bias component can include an impedance coupled between the gate of the first transistor 671 and the gate of the second transistor 672. In various implementations, the impedance can include a resistor and a capacitor coupled in series (e.g., the resistor 643 and the capacitor 651). Such a bias component can include a capacitor (e.g., the capacitor 653) coupled between a ground voltage and a node disposed between the first transistor 671 and the second transistor 672 (e.g., the intermediate cascode node 699).

Figure 6B:
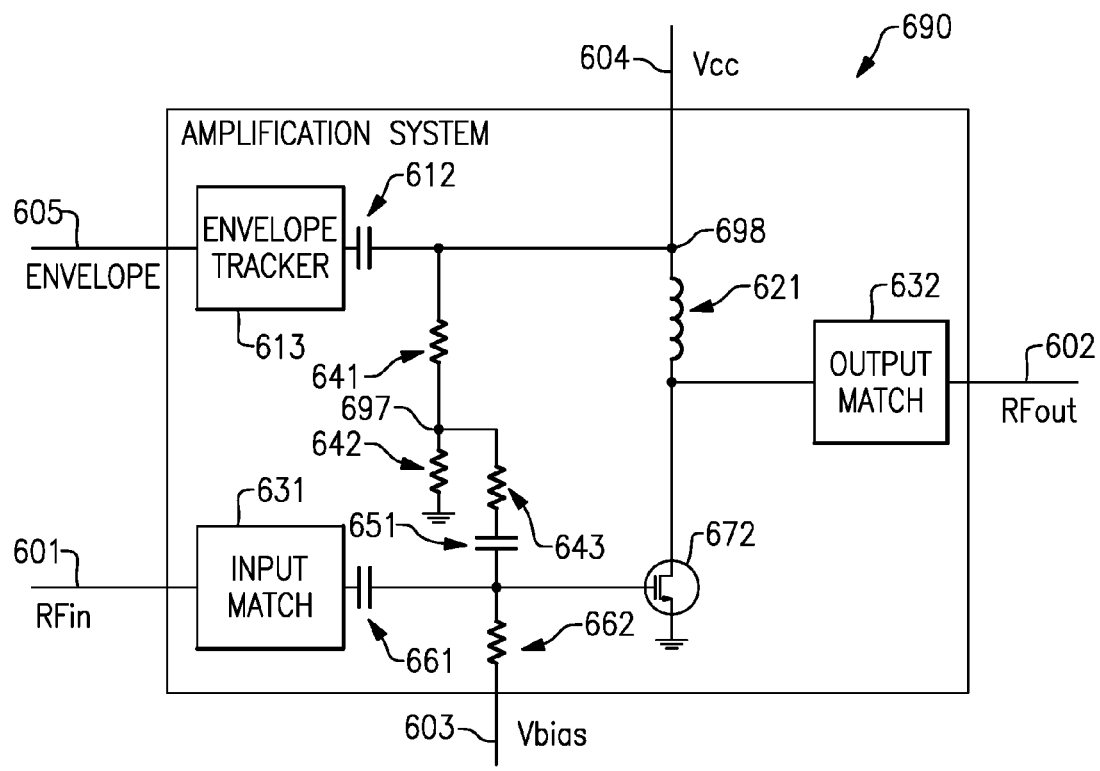
FIG. 6B illustrates an example amplification system that includes a single transistor.

FIG. 6B shows that in some implementations, an amplification system 690 can include a single transistor 672. The amplification system 690 of FIG. 6B includes many of the same components as the amplification system 600 of FIG. 6A, but excludes some of the components of the amplification system 600 of FIG. 6A. In particular, the amplification system 690 of FIG. 6B includes only a single transistor 672, rather than a cascode power amplifier including two transistors. Further, the amplification system 690 of FIG. 6B includes only a single inductor 621, rather than two inductors coupling the supply port 604 to the output port 602.

Figure 7A:
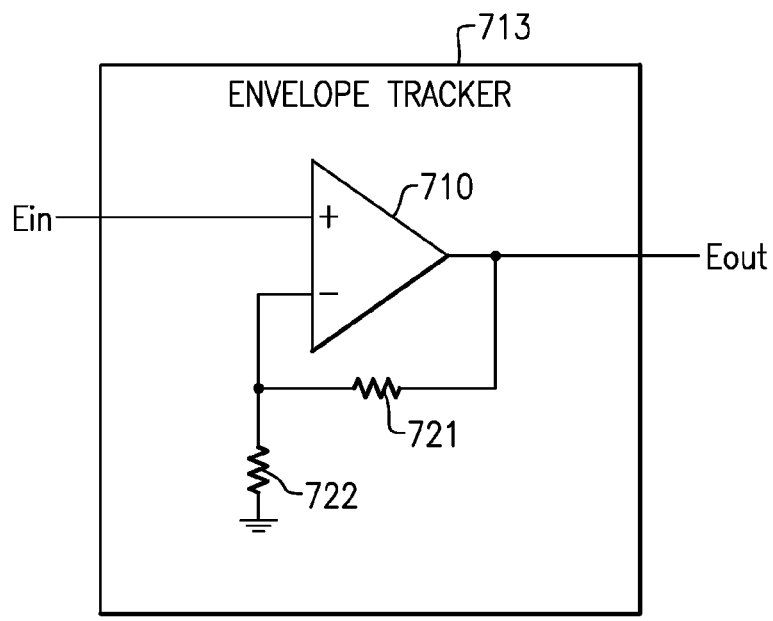
FIG. 7A illustrates an example envelope tracker implemented as a buffer amplifier.

FIG. 7A shows that in some implementations, an envelope tracker 713 can be implemented as a buffer amplifier. The envelope tracker 713 includes an input that receives an envelope signal (Ein) and provided a processed envelope signal (Eout). The envelope tracker 710 includes a differential amplifier 710 (which may be implemented, for example, as an operational amplifier) having a non-inverting input coupled to the input of the envelope tracker 713 and an inverting input coupled to the output of the envelope tracker 713 via a resistor 721. The inverting input is further coupled to a ground voltage via a resistor 722. The output of the differential amplifier 710 is coupled to the output of the envelope tracker 713.

Figure 7B:
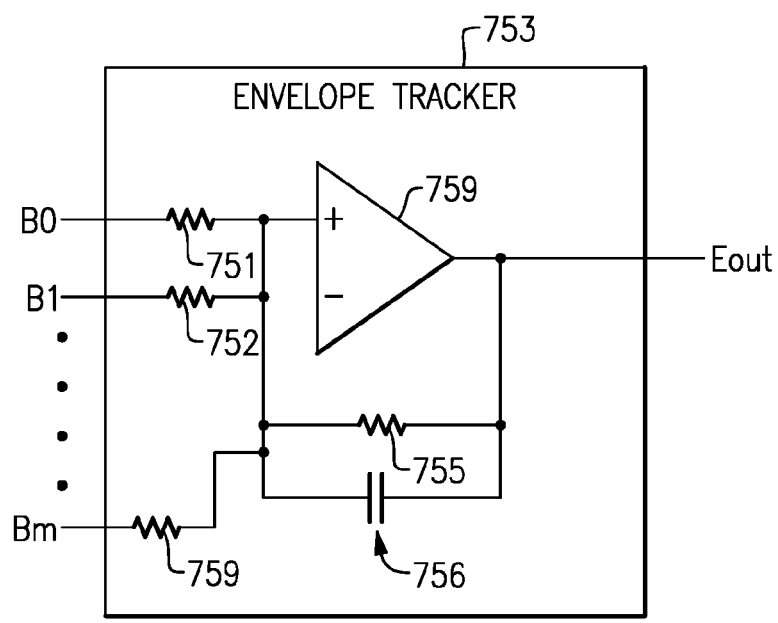
FIG. 7B illustrates an example envelope tracker implemented as a digital-to-analog (D/A) converter.

FIG. 7B shows that in some implementations, an envelope tracker 753 can be implemented as a digital-to-analog (D/A) converter. The envelope tracker 753 receives a first one-bit digital signal (B0) via a first resistor 751 and a second one-bit digital signal (B1) via a second resistor 752. The second resistor 752 may be twice the resistance of the first resistor 751. In some implementations, the envelope tracker 753 receives additional one-bit signals (e.g., Bm) via additional resistors (e.g., resistor 759). In some implementations, the envelope signal is a one-bit signal received via a single terminal, a two-bit signal received via two terminals, or a three-or-more-bit signal received via three or more terminals. Thus, the digital envelope signal received by the envelope tracker 753 can include two or more concurrent digital signals.

The digital envelope signals are fed to an amplifier 759 to effect a digital-to-analog conversion. The output of the amplifier 759 is fed back to the input via a low-pass RC filter including a RC resistor 755 and an RC capacitor 756 connected in parallel. The output of the amplifier 759 provides an envelope tracking signal that may be combined with a supply voltage (e.g., via an LC combiner) as shown in, e.g., FIG. 6A to power a power amplifier. Thus, the envelope tracking signal is generated by a digital-to-analog conversion of a digital envelope signal.

Figure 8:
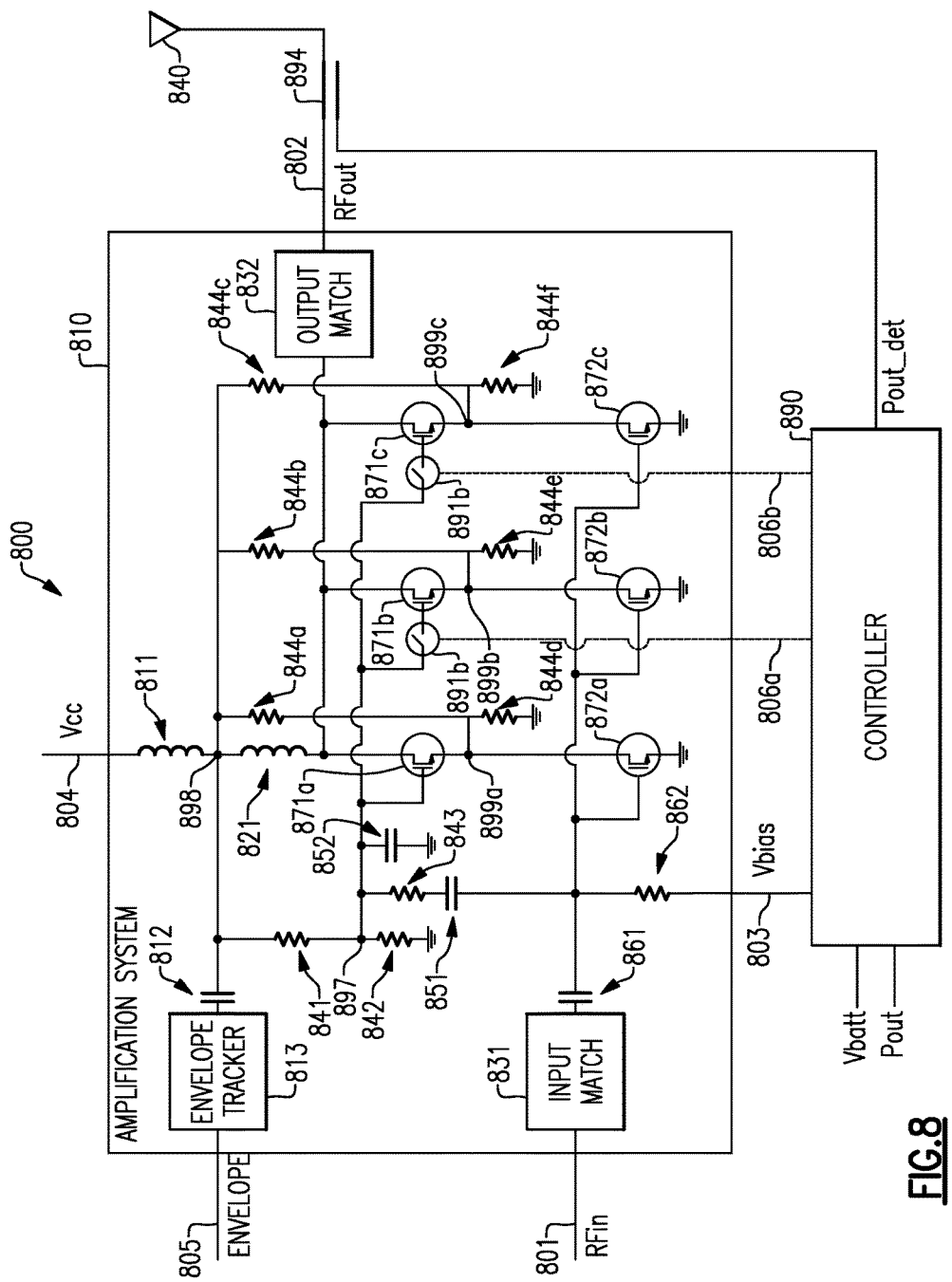
FIG. 8 illustrates an example power amplification configuration that includes an amplification system with multiple cascode amplifiers controlled by a controller.

FIG. 8 shows that in some embodiments, a power amplification configuration 800 can include an amplification system 810 with multiple cascode amplifiers controlled by a controller 890. The amplification system 810 receives an input RF signal (RFin) via an input port 801 and provides, as an output RF signal (RFout) at an output port 802, an amplified version of the input RF signal. The amplification system 810 includes a bias port 803 for receiving a biasing signal to bias one or more power amplifiers (or one or more transistors thereof) and multiple control ports 806a-806b for activating or deactivating the cascode amplifiers. The amplification system 800 includes a supply port 804 for receiving a supply voltage to power the amplification system 810. The amplification system 810 includes an envelope port 805 for receiving an envelope signal.

The amplification system 810 includes a plurality of cascode amplifiers, each formed by a respective first transistor 871a-871c and a respective second transistor 872a-872c. Each of the first transistors 871a-871c is configured as a common-base stage of its respective cascode amplifier and each of the second transistors 872a-872c is configured as a common-emitter stage of its respective cascode amplifier.

Each of the second transistors 872a-872c has a gate coupled to the input port 801 via an input matching component 831 and a capacitor 861. The gate of each of the second transistors 872a-872c is also coupled to the bias port 803 via a resistor 862. The capacitor 861 and the resistor 862 act as an RC combiner that combines that biasing signal (Vbias) and the matched input RF signal (RFin).

Each of the second transistors 872a-872c has a source coupled to a ground voltage and a drain coupled to a respective intermediate cascode node 899a-899c. Each of the intermediate cascode nodes 899a-899c may optionally be coupled to the ground voltage via a respective capacitor (not shown).

Each of the first transistors 871a-871c has a source coupled to the respective intermediate cascode node 899a-899c and a drain coupled, via an output matching component 832, to the output port 802. The input matching component 831 and output matching component 832 can provide impedance matching functionality for the amplification system 810.

As shown in FIG. 8, the respective drain of each of the first transistors 871a-871c is coupled, via an inductor 821 to an envelope-based supply node 898. In some embodiments, the drains of the first transistors 871a-871c are coupled via respective inductors to the envelope-based supply node 898.

The envelope-based supply node 898 is coupled, via an inductor 811, to the supply port 804 and is coupled, via a capacitor 812, to the output of an envelope tracker 813. The envelope tracker 813 receives the envelope signal via the envelope port 805 and provides a filtered or otherwise processed version of the envelope signal. The capacitor 812 and the inductor 811 act as an LC combiner that combines the processed envelope signal and the supply voltage to provide an envelope-based supply voltage at the envelope-based supply node 898.

The envelope-based supply node 898 and the intermediate cascode nodes 899a-899c can be coupled by respective resistors 844a-844c. Further, the intermediate cascode nodes 899a-899c and the ground voltage can be coupled by respective resistors 844d-844f. Thus, the envelope-base supply node 898 is coupled to the ground voltage via (at least) three pairs of resistors 844a-844f.

The envelope-based supply node 898 is further coupled the ground voltage via another pair of resistors 841, 842. The pair of resistors 841, 842 act as a voltage divider, such that the voltage at a divided node 897 between the two resistors 841, 842 is less than the voltage at the envelope-based supply node 898. In particular, the pair of resistors includes a resistor 841 coupled between the envelope-based supply node 898 and the divided node 897 and a resistor 842 coupled between the divided node 897 and the ground voltage. In general, each of the resistors, capacitors, and inductors described herein (with respect to FIG. 8 and other figures) can be replaced with different impedances including one or more resistors, capacitors, and/or inductors.

The respective gates of the each of the first transistors 871a-871c are coupled to the divided node 897. As shown in FIG. 8, the gate of one of the first transistors 871a is coupled directly to the divided node 897 and the gates of the other first transistors 871b, 871c are coupled to the divided node 897 via respective switches 891b, 891c. In some embodiments, each of the gates of the first transistors 871a-871c are coupled to the divided node 897 via respective switches. The switches 891b, 891c can be controlled by the controller 890 to be in an open state or a closed state.

The controller 890 can determine which of the switches to place in the open state or the closed state by comparing a received desired output power signal (Pout) with an actual output power measured by a coupler 894 at the output port 802 of the amplification system 810 (e.g., coupled between the output port 802 of the amplification system 810 and an antenna 840). In various implementations, the controller is powered by voltage from a battery (Vbatt) and can generate the biasing signal (Vbias) using this voltage.

Thus, when its respective switch is in the closed state, each first transistor 871a-871c is biased by the voltage at the divided node 897. In various implementations, the divided node 897 is coupled to the ground voltage via a capacitor 852 which may act as an acceleration capacitor. In various implementations, the divided node 897 is coupled to the gate of each of the second transistors 872a-872c via an impedance. As shown in FIG. 8, such an impedance can include a resistor 843 and/or a capacitor 851.

Thus, in various implementations, each of the cascode power amplifiers (when switched on by the controller 890) is biased by a voltage based on the envelope signal, e.g., the respective first transistor 871a-871c is biased by the voltage at the divided node 897. Further, each of the cascode power amplifiers is powered by a voltage based on the envelope signal, e.g., each of the cascode amplifiers is powered by the voltage at the envelope-based supply node 898.

Figure 9:
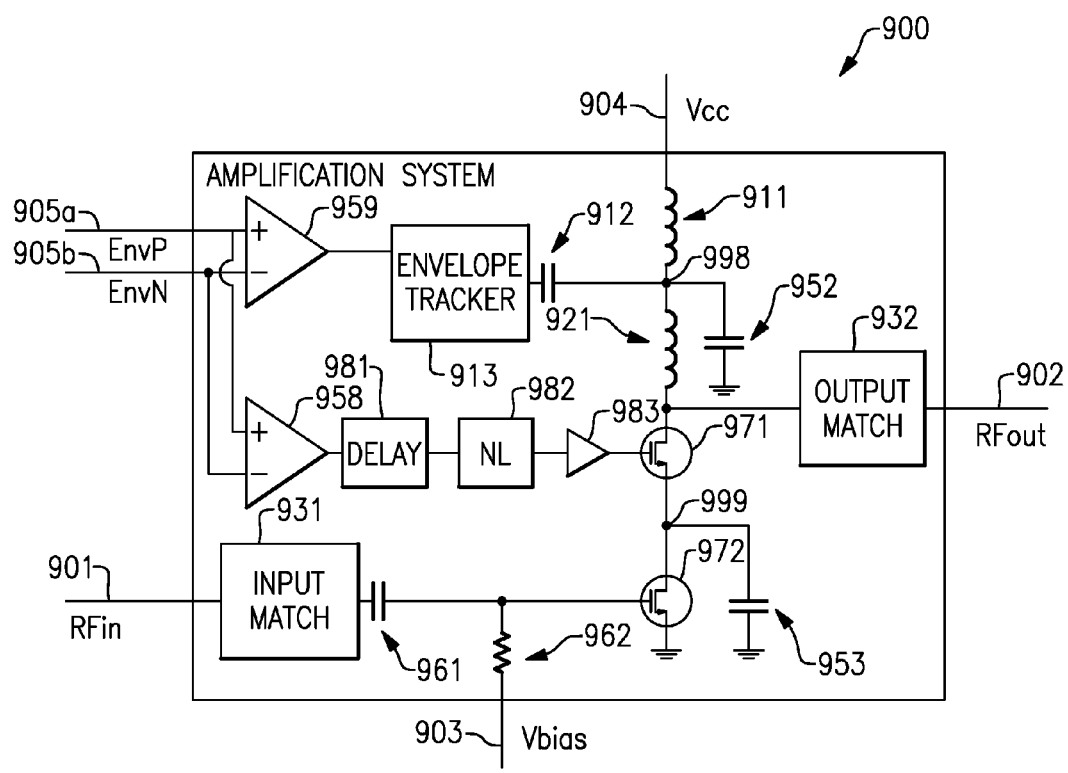
FIG. 9 illustrates an example amplification system that includes a non-linear device.

FIG. 9 shows that in some embodiments, an amplification system 900 can include a non-linear device 982. The amplification system 900 receives an input RF signal (RFin) via an input port 901 and provides, as an output RF signal (RFout) at an output port 902, an amplified version of the input RF signal. The amplification system 900 includes a bias port 903 for receiving a biasing signal to bias a power amplifier (or one or more transistors thereof). The amplification system 900 includes a supply port 904 for receiving a supply voltage to power the amplification system 900. The amplification system 900 includes envelope ports 905a, 905b for receiving a differential envelope signal.

The amplification system 900 includes a cascode amplifier in the form of a first transistor 971 and a second transistor 972. The first transistor 971 is configured as a common-base stage of the cascode amplifier and the second transistor 972 is configured as a common-emitter stage of the cascode amplifier.

The second transistor 972 has a gate coupled to the input port 901 via an input matching component 931 and a capacitor 961. The gate of the second transistor 972 is also coupled to the bias port 903 via a resistor 962. The capacitor 961 and the resistor 962 act as an RC combiner that combines that biasing signal (Vbias) and the matched input RF signal (RFin).

The second transistor 972 has a source coupled to a ground voltage and a drain coupled to an intermediate cascode node 999. The intermediate cascode node 999 may optionally be coupled to the ground voltage via a capacitor 953.

The first transistor 971 has a source coupled to the intermediate cascode node 999 and a drain coupled, via an output matching component 932, to the output port 902. The input matching component 931 and output matching component 932 can provide impedance matching functionality for the amplification system 900.

The drain of the first transistor 971 is coupled via an inductor 921 to an envelope-based supply node 998. The envelope-based supply node 998 is coupled, via an inductor 911, to the supply port 904 and is coupled, via a capacitor 912, to the output of an envelope tracker 913. The envelope-based supply node 998 is further coupled, via a capacitor 952, to ground. The envelope tracker 913 receives the envelope signal via the output of a differential amplifier 959 coupled to the envelope ports 605a, 605b and provides a filtered or otherwise processed version of the envelope signal. The capacitor 912 and the inductor 911 act as an LC combiner that combines the processed envelope signal and the supply voltage to provide an envelope-based supply voltage at the envelope-based supply node 998.

The envelope signal is also output from a second differential amplifier 958 through a processing chain to the gate of the first transistor 971. The processing chain includes a delay component 981, a non-linear device 982, and a buffer 983. The non-linear device 982 can provide an output voltage that is a non-linear function of the input voltage (a delayed version of the envelope signal).

Thus, in various implementations, the cascode power amplifier is biased by a voltage based on the envelope signal, e.g., the first transistor 971 is biased by the voltage from the buffer 983 (a non-linearly processed and delayed version of the envelope signal). Further, the cascode power amplifier is powered by a voltage based on the envelope signal, e.g., the cascode amplifier is powered by the voltage at the envelope-based supply node 998.

Figure 10:
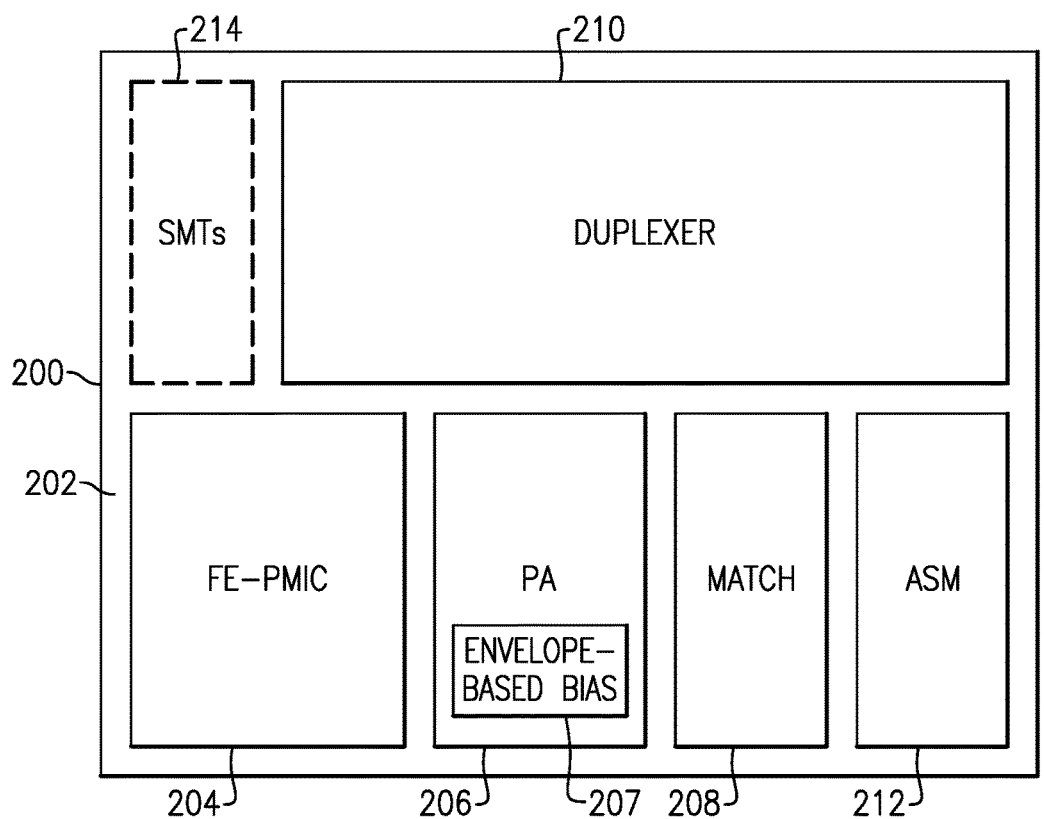
FIG. 10 illustrates an example module that incorporates an amplification system with an envelope-based bias.

FIG. 10 shows that in some embodiments, some or all of power amplification systems (e.g., those shown in FIGS. 5, 6A, 6B, 8, and 9) can be implemented, wholly or partially, in a module. Such a module can be, for example, a front-end module (FEM). In the example of FIG. 10, a module 200 can include a packaging substrate 202, and a number of components can be mounted on such a packaging substrate. For example, an FE-PMIC (Front-end Power Management Integrated Circuit) component 204, a power amplifier assembly 206, a match component 208, and a duplexer assembly 210 can be mounted and/or implemented on and/or within the packaging substrate 202. The power amplifier assembly 206 can include an envelope-based bias component 207 such as those described above with respect to FIGS. 5, 6A, 6B, 8, and 9. Other components such as a number of SMT (surface-mount technology) devices 214 and an antenna switch module (ASM) 212 can also be mounted on the packaging substrate 202. Although all of the various components are depicted as being laid out on the packaging substrate 202, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 11:
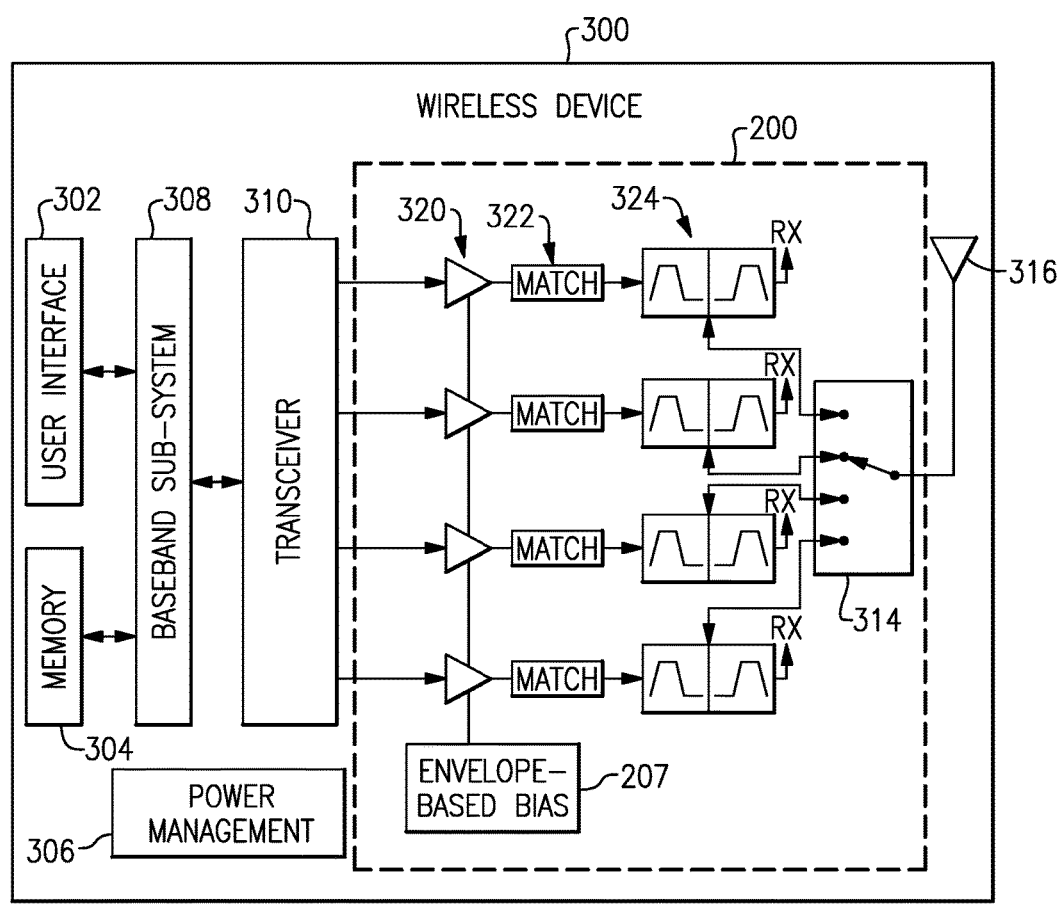
FIG. 11 illustrates an example wireless device that incorporates an amplification system with an envelope-based bias.

FIG. 11 depicts an example wireless device 300 having one or more advantageous features described herein. In the context of a module having one or more features as described herein, such a module can be generally depicted by a dashed box 200, and can be implemented as, for example, a front-end module (FEM).

Referring to FIG. 11, power amplifiers (PAs) 320 can receive their respective RF signals from a transceiver 310 that can be configured and operated in known manners to generate RF signals to be amplified and transmitted, and to process received signals. The transceiver 310 is shown to interact with a baseband sub-system 308 that is configured to provide conversion between data and/or voice signals suitable for a user and RF signals suitable for the transceiver 310. The transceiver 310 can also be in communication with a power management component 306 that is configured to manage power for the operation of the wireless device 300. Such power management can also control operations of the baseband sub-system 308 and the module 200.

The baseband sub-system 308 is shown to be connected to a user interface 302 to facilitate various input and output of voice and/or data provided to and received from the user. The baseband sub-system 308 can also be connected to a memory 304 that is configured to store data and/or instructions to facilitate the operation of the wireless device, and/or to provide storage of information for the user.

In the example wireless device 300, outputs of the PAs 320 are shown to be matched (via respective match circuits 322) and routed to their respective duplexers 324. Such amplified and filtered signals can be routed to an antenna 316 through an antenna switch 314 for transmission. In some embodiments, the duplexers 324 can allow transmit and receive operations to be performed simultaneously using a common antenna (e.g., 216). In FIG. 11, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
    a power amplifier configured to amplify an input radio-frequency (RF) signal to generate an output RF signal when biased by a biasing signal, the power amplifier including a plurality of cascode amplifiers coupled in parallel; and
    a bias component configured to generate the biasing signal based on an envelope signal indicative of an envelope of the input RF signal.

2. The power amplification system of claim 1 further comprising a supply component configured to generate an envelope-based supply voltage for powering the power amplifier.

3. The power amplification system of claim 2 wherein the biasing signal is configured to enhance a linearity of the power amplifier.

4. The power amplification system of claim 1 wherein the power amplifier includes a cascode power amplifier including a first transistor and a second transistor.

5. The power amplification system of claim 4 wherein the first transistor has a gate to receive the biasing signal, a drain coupled to a supply voltage, and a source coupled to a drain of the second transistor.

6. The power amplification system of claim 5 wherein the second transistor has a gate coupled to a supplemental biasing signal and a source coupled to a ground voltage.

7. The power amplification system of claim 6 wherein the supplemental biasing signal is based on the envelope signal.

8. The power amplification system of claim 6 wherein the supplemental biasing signal is independent of the envelope signal.

9. The power amplification system of claim 4 wherein the input RF signal is received at an input RF port coupled to the gate of the second transistor and the output RF signal is provided at an output RF port coupled to the drain of the first transistor.

10. The power amplification system of claim 7 wherein the input RF port is coupled to the gate of the second transistor via an input matching component and the output RF port is coupled to the drain of the first transistor via an output matching component.

11. The power amplification system of claim 1 further comprising a bias time alignment circuit configured to align in time the biasing signal with the envelope signal.

12. The power amplification system of claim 11 further comprising an envelope alignment circuit configured to align in time the biasing signal and the envelope signal.

13. The power amplification system of claim 12 further comprising a bias shaping circuit configured to manipulate a shape of the biasing signal to enhance linearity or efficiency of the power amplifier.

14. The power amplification system of claim 1 further comprising one or more switches configured to pass or block the biasing signal to a respective one or more of the plurality of cascode amplifiers.

15. The power amplification system of claim 14 further comprising a controller configured to set a respective state of the one or more switches based on a power output.

16. A radio-frequency (RF) module comprising:
    a packaging substrate configured to receive a plurality of components; and
    a power amplification system implemented on the packaging substrate, the power amplification system including a power amplifier configured to amplify an input radio-frequency (RF) signal to generate an output RF signal when biased by a biasing signal, the power amplifier including a plurality of cascode amplifiers coupled in parallel, and a bias component configured to generate the biasing signal based on an envelope signal indicative of an envelope of the input RF signal.

17. The RF module of claim 16 wherein the power amplifier includes a cascode power amplifier including a first transistor and a second transistor, the first transistor being biased by the biasing signal, the second transistor being biased by a supplemental biasing signal.

18. The RF module of claim 16 further comprising a supply component implemented on the packaging substrate, the supply component configured to generate an envelope-based supply voltage for powering the power amplifier.

19. A wireless device comprising:
    a transceiver configured to generate a radio-frequency (RF) signal;
    a front-end module (FEM) in communication with the transceiver, the FEM including a packaging substrate configured to receive a plurality of components, the FEM further including a power amplification system implemented on the packaging substrate, the power amplification system including a power amplifier configured to amplify an input radio-frequency (RF) signal to generate an output RF signal when biased by a biasing signal, the power amplifier including a plurality of cascode amplifiers coupled in parallel, and a bias component configured to generate the biasing signal based on an envelope signal indicative of an envelope of the input RF signal; and
    an antenna in communication with the FEM, the antenna configured to transmit the output RF signal received from the power amplification system.

* * * * *